US010462946B2

(12) United States Patent
Takahashi et al.

(10) Patent No.: US 10,462,946 B2
(45) Date of Patent: Oct. 29, 2019

(54) COMPONENT MOUNTING MACHINE AND TAPE PEELING RECOVERY METHOD FOR COMPONENT MOUNTING MACHINE

(71) Applicant: FUJI CORPORATION, Chiryu-shi (JP)

(72) Inventors: Akira Takahashi, Okazaki (JP); Toshimitsu Honda, Okazaki (JP)

(73) Assignee: FUJI CORPORATION, Chiryu-shi (JP)

(*) Notice: Subject to any disclaimer, the term of this patent is extended or adjusted under 35 U.S.C. 154(b) by 198 days.

(21) Appl. No.: 15/557,960

(22) PCT Filed: Mar. 18, 2015

(86) PCT No.: PCT/JP2015/058059
§ 371 (c)(1),
(2) Date: Sep. 13, 2017

(87) PCT Pub. No.: WO2016/147339
PCT Pub. Date: Sep. 22, 2016

(65) Prior Publication Data
US 2018/0064006 A1 Mar. 1, 2018

(51) Int. Cl.
H05K 13/02 (2006.01)
H05K 13/04 (2006.01)
H05K 13/08 (2006.01)

(52) U.S. Cl.
CPC ......... H05K 13/02 (2013.01); H05K 13/0408 (2013.01); H05K 13/0417 (2013.01);
(Continued)

(58) Field of Classification Search
CPC ............... H05K 13/02; H05K 13/0408; H05K 13/0417; H05K 13/0419; H05K 13/08;
(Continued)

(56) References Cited

U.S. PATENT DOCUMENTS

2003/0183347 A1* 10/2003 Okawa ............... H05K 13/0419
156/751
2010/0242267 A1* 9/2010 Tsukagoshi ........ H05K 13/0417
29/739

FOREIGN PATENT DOCUMENTS

CN 101841999 A 9/2010
JP 2014-127517 A 7/2014

OTHER PUBLICATIONS

Extended European Search Report dated Dec. 18, 2017 in corresponding European Patent Application No. 15885435.6.
(Continued)

Primary Examiner — Peter Dungba Vo
Assistant Examiner — Joshua D Anderson
(74) Attorney, Agent, or Firm — Oblon, McClelland, Maier & Neustadt, L.L.P.

(57) ABSTRACT

A component mounting machine includes a feeder device that has a tape feeding mechanism that feeds out a carrier tape that stores components in respective component storage sections, and a tape peeling mechanism that has a tape peeling blade that carries out peeling, and a component transfer device that has a mounting head that holds a suction nozzle, and a head driving mechanism, the component mounting machine further provided with a peeling start determination section of determining whether or not the peeling starts before the suction nozzle starts a suction operation, and a recovery function section of carrying out a recovery operation in which the recovery function section returns the leading end of the carrier tape temporarily to the front of the tape peeling blade and feeds out the carrier tape again in a case where it is determined that peeling is not started.

5 Claims, 4 Drawing Sheets

(52) U.S. Cl.
CPC ......... *H05K 13/0419* (2018.08); *H05K 13/08* (2013.01); *H05K 13/086* (2018.08); *H05K 2203/0264* (2013.01); *Y10T 29/4913* (2015.01); *Y10T 29/53174* (2015.01); *Y10T 29/53191* (2015.01)

(58) Field of Classification Search
CPC ................ H05K 13/081; H05K 13/086; Y10T 29/4913; Y10T 29/49131; Y10T 29/43174; Y10T 29/53174; Y10T 29/53178
See application file for complete search history.

(56) References Cited

OTHER PUBLICATIONS

International Search Report dated Jun. 23, 2015 in PCT/JP2015/058059 filed Mar. 18, 2015.

\* cited by examiner

COMPONENT MOUNTING MACHINE AND TAPE PEELING RECOVERY METHOD FOR COMPONENT MOUNTING MACHINE

TECHNICAL FIELD

The present application relates to a component mounting machine that is provided with a feeder device that feeds out a carrier tape and supplies a component, and in further detail, relates to a reliability improvement of a tape peeling operation for peeling a cover tape from a bottom tape that constitutes the carrier tape.

BACKGROUND ART

A solder printing machine, a component mounting machine, a reflow machine, a board inspection machine, and the like may be used as a facility for producing a board on which multiple components are mounted. Typically, such facilities are connected with each other to constitute a board production line. The component mounting machines are provided with a board conveyance device, a component supply device, a component transfer device, and a control device. A feeder device for feeding out the carrier tape on which multiple components are stored at a predetermined pitch may be used as a representative example of the component supply device. The carrier tape includes the bottom tape which stores the components in the respective multiple component storage sections and a cover tape that is adhered to the bottom tape and covers the component storage sections. Typically, the feeder device is provided with a tape peeling mechanism that peels the cover tape from the bottom tape so that the components can be supplied. A technical example which relates to this type of feeder device is disclosed in PTL 1.

PTL 1 discloses a cover tape peeling method when a succeeding carrier tape is introduced after the preceding carrier tape. The cover tape peeling method includes a feeding out step for causing a tail end of the preceding carrier tape and the leading end of the succeeding carrier tape to abut and feeding out the tail end of the preceding carrier tape further to the downstream side than a peeling blade (tape peeling blade), a reverse flow step for causing the leading end of the succeeding carrier tape to flow in reverse further up to the upstream side than the peeling blade, and a retransfer step for retransferring and peeling the succeeding carrier tape. Thereby, it is possible to feed out the succeeding carrier tape to a position that does not interfere with the peeling blade and it is possible to accurately engage with the peeling blade between a base tape (bottom tape) and the cover tape of the succeeding carrier tape.

Furthermore, a state in which a reverse flow step and a retransfer step are carried out again is disclosed in a case where error information that it is not possible to take out the components from the succeeding carrier tape is received. Thereby, it is possible to perform a peeling operation again, and it is possible to maintain operation of the component mounting machine without depending on manual operation. Not limited to PTL 1, a success rate of the peeling operation at the leading end of the carrier tape is not 100%. When a defect occurs in the peeling operation, in the related art, a carrier tape is temporarily discharged and the state of the leading end is confirmed, and a countermeasure such as carrying out cutting of a tape accompanying loss of the component is carried in a case where the state is bad.

CITATION LIST

Patent Literature

PTL 1: JP-A-2014-127517

SUMMARY

Technical Problem

Note that, in the technology of PTL 1, error information that it is not possible to take out a component from the succeeding carrier tape means defects occurring in the peeling operation. The error information is issued in a case where it is not possible to suck a component by the suction nozzle of the component transfer device. In this arrangement, in order to determine whether or not a component is sucked by the suction nozzle, a suction operation is performed by the suction nozzle, the leading end of the suction nozzle is captured by the camera for imaging the component, the captured image is subjected to image processing and presence or absence of the component is determined. The determination method can be carried out only during actual production in which the components are mounted on a board. Therefore, time lag occurs in the issuing of the error information, and production efficiency is lowered during defective production of the peeling operation. Accordingly, it is necessary to quickly detect defects in the peeling operation before starting actual production.

Furthermore, in the technology of PTL 1, the error information is overlooked without issuing the error information in a case where the suction nozzle sucks a component and defects occur on a path of the carrier tape. In addition, during occurrence of defects in the peeling operation, it may not be possible to recover the defects in the recovery operation in which the same peeling operation is simply repeated. Accordingly, it is preferable to increase defect determination precision in the peeling operation, increase a success rate of the recovery operation, and improve a countermeasure to unsuccessful recovery.

The present disclosure is made in consideration of the problems of the background art, and a problem to be solved is to provide a component mounting machine that is able to quickly determine whether or not peeling has started after the leading end of the carrier tape in the feeder device is fed out up to a tape peeling blade and a tape peeling recovery method that is able to quickly determine whether or not peeling has started.

Solution to Problem

A component mounting machine according to the disclosure to solve the problems described above includes: a feeder device that has a tape feeding mechanism which feeds out a carrier tape including a bottom tape which stores components in respective multiple component storage sections and a cover tape which is adhered to the bottom tape and covers the component storage sections, and a tape peeling mechanism which has a tape peeling blade advancing between the bottom tape and the cover tape as the carrier tape is fed out and carries out peeling, and supplies the component from the component storage section at component supply position; a component transfer device that has a mounting head which holds a suction nozzle which sucks the component at the component supply position, and mounts the component on a board, and a head driving mechanism which drives the mounting head, a peeling start determination section that determines whether or not the tape peeling blade advances between the bottom tape and the cover tape and the peeling starts, after the leading end of the carrier tape is fed out up to the tape peeling blade and before the suction nozzle starts a suction operation at the component supply position; and a recovery function section that carries out a recovery operation in which the recovery function section returns the leading end of the carrier tape temporarily to the front of the tape peeling blade and feeds out the carrier tape again in a case where it is determined that peeling is not started by the peeling start determination section.

Advantageous Effects

A component mounting machine of the present disclosure determines whether or not a tape peeling blade advances between a bottom tape and a cover tape and the peeling starts after the leading end of the carrier tape is fed out up to the tape peeling blade and before a suction nozzle starts a suction operation at a component supply position, and carries out a recovery operation in a case where it is determined that peeling is not started. Accordingly, in comparison with the related art in which error information is issued after a suction nozzle performs a suction operation, according to the present disclosure, it is possible to quickly determine whether or not peeling is started.

DESCRIPTION OF EMBODIMENTS (1. Device Configuration of Component Mounting Machine 1 of Embodiment)

Figure 1:
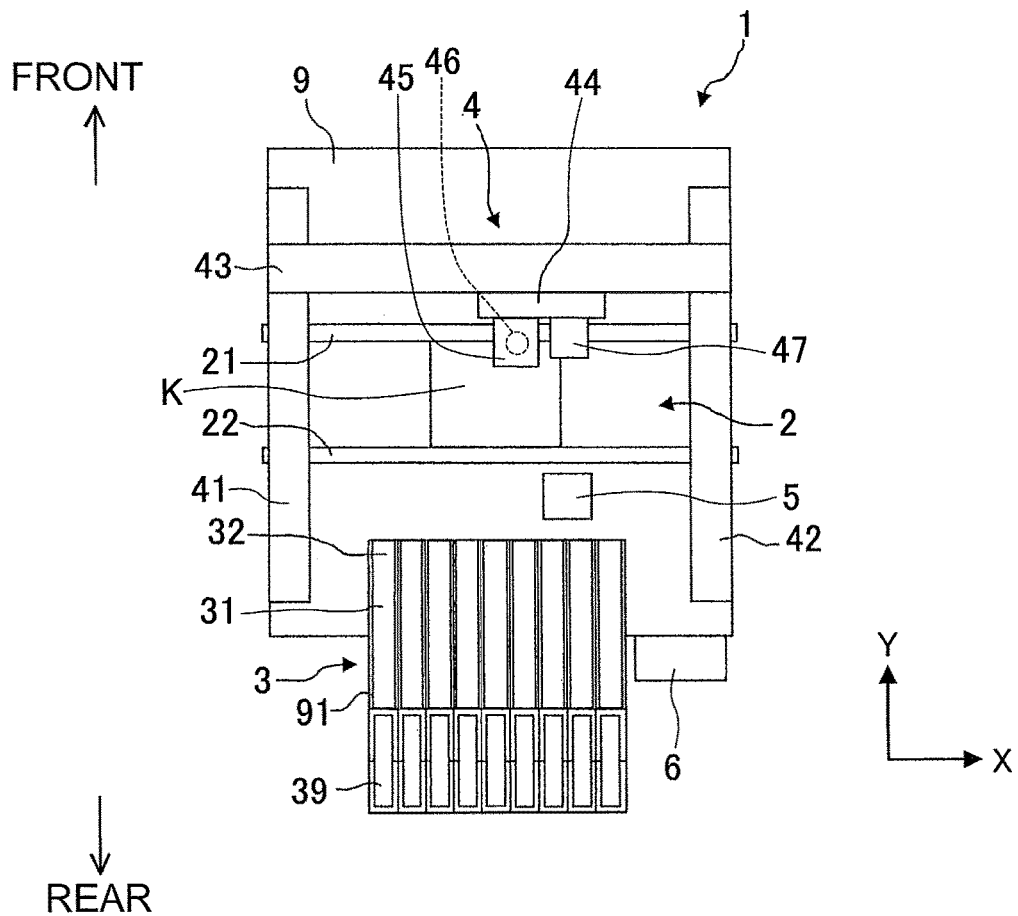
FIG. 1 is a planar view illustrating a device configuration of a component mounting machine of an embodiment.

A device configuration of a component mounting machine 1 of an embodiment of the present disclosure will be described with reference to FIG. 1. FIG. 1 is a planar view illustrating the device configuration of the component mounting machine 1 of the embodiment. A direction from a paper surface left side toward the right side in FIG. 1 is an X-axis direction along which a board K is carried in and out, and a direction from the rear on the paper surface lower side toward the front of the paper surface upper side is a Y-axis direction. The component mounting machine 1 is configured by assembling a board conveyance device 2, multiple feeder devices 3, a component transfer device 4, a component camera 5, a control device 6, and the like on a frame 9. The board conveyance device 2, each feeder devices 3, the component transfer device 4, and the component camera 5 are controlled by the control device 6, and respectively carry out predetermined work.

The board conveyance device 2 carries in the board K to a mounting work position, and positions and carries out the board K. The board conveyance device 2 is configured by a pair of guide rails 21, 22, a pair of conveyor belts, a backup device, and the like. The pair of guide rails 21, 22 cut across an upper face center of the frame 9 extend in a conveyance direction (X-axis direction), and are assembled parallel to each other on the frame 9. The pair of conveyor belts with endless rings not shown in the diagram are arranged side by side inside the pair of guide rails 21, 22 facing each other. The pair of conveyor belts revolve in a state in which both edges of the board K are respectively placed on the conveyor conveyance surfaces, and the board K is carried in and carried out to the mounting work position that is set in the center section of the frame 9. The backup device not shown in the diagram is arranged below the mounting work position. The backup device pushes up the board K and clamps the board K in a horizontal posture and positions the board K at the mounting work position. Thereby, the mounting operation is carried out at the mounting work position by the component transfer device 4.

The multiple feeder devices 3 supply each of the components sequentially. The multiple feeder devices 3 have a flat shape with small dimensions in the width direction, and are equipped lined up on a pallet table 91 on the upper face of the frame 9. Each feeder device 3 has a main body section 31, a tape reel 39 that is provided on a rear section of the main body section 31, a component supply position 32 that is provided in an upper section near the front end of the main body section 31, and the like. The carrier tape 8 (refer to FIG. 4 and FIG. 5) is wound and held on the tape reel 39. The carrier tape 8 is fed out by a predetermined pitch, a component is released from the storage state and sequentially supplied to the component supply position 32. Detailed description of the feeder device 3 will be made later.

The component transfer device 4 sucks a component from each component supply position 32 of the multiple feeder devices 3, and the component is conveyed up to the positioned board K and mounted. The component transfer device 4 is a device of an XY-robot type that is horizontally movable in the X-axis direction and the Y-axis direction. The component transfer device 4 is constituted by a pair of Y-axis rails 41 and 42 and a Y-axis slider 43 that constitute a head driving mechanism, a mounting head 44, a nozzle tool 45, a suction nozzle 46, a board camera 47, and the like. The pair of Y-axis rails 41 and 42 are arranged closer to both side faces of the frame 9 and extend in the front-rear direction (Y-axis direction). The Y-axis slider 43 is mounted to be movable on the Y-axis rails 41 and 42. The Y-axis slider 43 is driven in the Y-axis direction by a Y-axis ball screw mechanism.

The mounting head 44 is mounted to be movable on the Y-axis slider 43. The mounting head 44 is driven in the X-axis direction by an X-axis ball screw mechanism. The nozzle tool 45 is held to be exchangeable on the mounting head 44. The nozzle tool 45 has one or multiple suction nozzles 46 that sucks a component and mounts the component on the board K. The board camera 47 is provided side by side with the nozzle tool 45 on the mounting head 44. The board camera 47 images a position fiducial mark that is attached to the board K and accurately detects the position of the board K.

The component camera 5 is provided with an upward orientation on an upper face of the frame 9 between the board conveyance device 2 and the feeder device 3. The component camera 5 images the state of a component that is sucked to the suction nozzle 46 while the mounting head 44 is moved from the feeder device 3 to the board K. When an error of suction posture or deviation of a rotation angle of the component is recognized according to the captured image data of the component camera 5, the control device 6 finely adjusts the component mounting operation as necessary and carries out control in which the component is discarded in a case where mounting is difficult.

The control device 6 is assembled on the frame 9 and the installation position of the control device 6 is not particularly limited. The control device 6 holds a mounting sequence in which the type and mounting order of the components that are mounted on the board K, the feeder devices 3 that supply the components, and the like are designated. The control device 6 controls the component mounting operation according to the mounting sequence based on the captured image data of the board camera 47 and the component camera 5, detection data of a sensor that is not shown in the drawings, and the like. In addition, the control device 6 sequentially collects and updates operation condition data such as a production number of completely produced boards K, mounting time that is necessary for mounting of the components, and an occurrence frequency of suction error of the components. The control device 6 is provided with a display section for displaying information to an operator and an input section for carrying out input setting by the operator. The control device 6 fulfills the role of a peeling start determination section and a recovery function section of the present disclosure by performing a process flow which will be described later.

(2. Detailed Configuration of Feeder Device 3)

Figure 2:
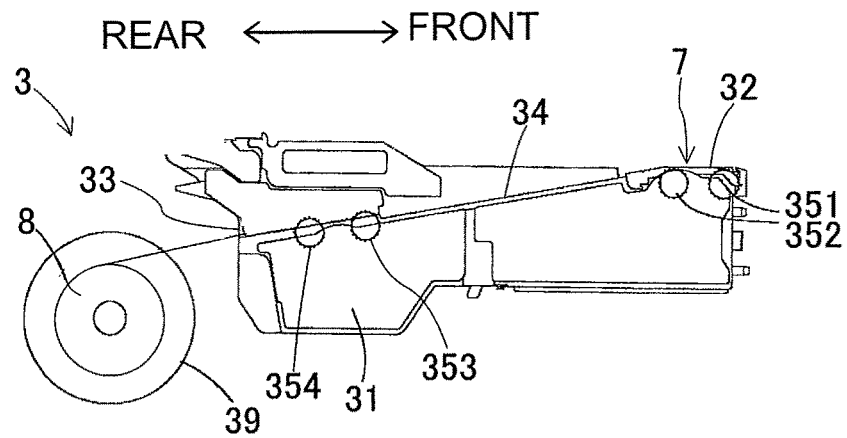
FIG. 2 is a side view of the feeder device.

Next, the detailed configuration of the feeder device 3 will be described. FIG. 2 is a side view of the feeder device 3. The feeder device 3 has a tape insertion port 33 close to an intermediate height at the tail end of the main body section 31. A feeding rail 34 is arranged from the tape insertion port 33 toward the front upper-end section of the main body section 31. The component supply position 32 is set on an upper face close to the front end of the feeding rail 34. The tape peeling mechanism 7 is arranged on the rear of the component supply position 32.

First and second sprockets 351 and 352 are rotatably supported below the feeding rail 34 to the front and rear of the component supply position 32. Teeth of the first and second sprockets 351 and 352 protrude from a groove that is formed on the feeding rail 34 and fit into a sprocket hole 84 of the carrier tape 8. The first and second sprockets 351 and 352 are synchronously driven by a front side servomotor not shown in the diagram and are able to be switched between forward rotation and reverse rotation.

Third and fourth sprockets 353 and 354 are rotatably supported on the lower side towards the rear close to the tape insertion port 33 of the feeding rail 34. Teeth of the third and fourth sprockets 353 and 354 protrude from a groove that is formed on the feeding rail 34 and fit into a sprocket hole 84 of the carrier tape 8. The third and fourth sprockets 353 and 354 are synchronously driven by a rear side servomotor that is not shown in the diagram and are able to be switched between forward rotation and reverse rotation. A tape feeding mechanism is constituted by the feeding rail 34, the first to fourth sprockets 351 to 354, front side and rear side servomotors, and the like.

The tape reel 39 around which the carrier tape 8 is wound is rotatably supported to the rear of the tape insertion port 33 of the feeder device 3. In tape loading work, an operator pulls out a leading end of the carrier tape 8 from the tape reel 39 and inserts the carrier tape 8 from the tape insertion port 33 up to the fourth sprocket 354. By doing this, the third and fourth sprockets 353 and 354 are driven to rotate forward and the carrier tape 8 is fed out. When the leading end of the carrier tape 8 reaches up to the second sprocket 352, the first and second sprockets 351 and 352 are driven forward and the carrier tape 8 is fed up to the component supply position 32. There is an automatic loading function of the carrier tape 8. Splicing work to connect two carrier tapes 8 is unnecessary due to the automatic loading function of the feeder device 3.

In addition, when the first to fourth sprockets 351 to 354 are driven in reverse, the carrier tape 8 is returned to the front side, and is discharged to the rear of the fourth sprocket 354. This is an automatic discharge function of the carrier tape 8 and corresponds to the tape discharging section of the present disclosure. In addition, after the carrier tape 8 is loaded, the first to fourth sprockets 351 to 354 are driven forward at a pitch feed. Thereby, the carrier tape 8 sequentially supplies a component at the component supply position 32.

(3. Configuration and Peeling Operation of Tape Peeling Mechanism 7)

Figure 3:
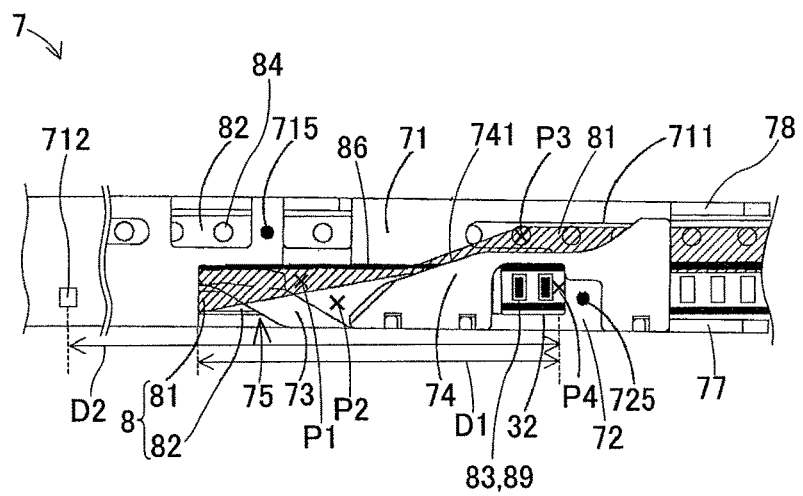
FIG. 3 is a planar view that describes a configuration and a peeling operation of a tape peeling mechanism.
Figure 4:
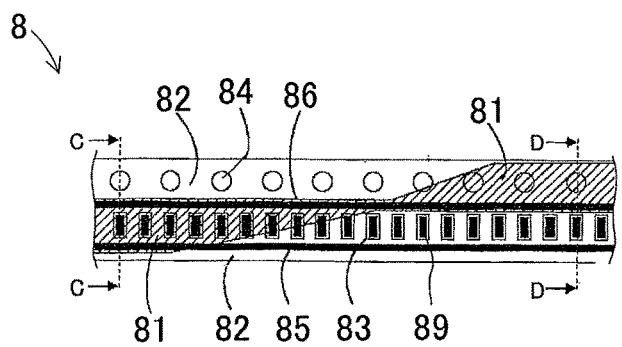
FIG. 4 is a planar view illustrating only a carrier tape in FIG. 3.
Figure 5:
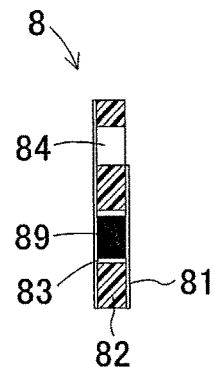
FIG. 5 is a sectional view of the carrier tape in a C-C arrow direction in FIG. 4.
Figure 6:
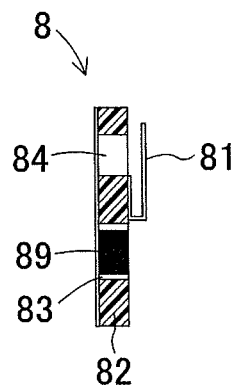
FIG. 6 is a sectional view of the carrier tape in a D-D arrow direction in FIG. 4, and illustrates a folded state of a cover tape.

Next, a configuration of the tape peeling mechanism 7 will be described. FIG. 3 is a planar view that describes the configuration and a peeling operation of the tape peeling mechanism 7. In addition, FIG. 4 is a planar view illustrating only the carrier tape 8 in FIG. 3. In FIG. 3 and FIG. 4, a cover tape 81 that constitutes the carrier tape 8 is illustrated as hatched for convenience. In addition, adhesive sections 85 and 86 and components 89 are illustrated in black for convenience. FIG. 5 is a sectional view of the carrier tape 8 in a C-C arrow direction in FIG. 4. FIG. 6 is a sectional view of the carrier tape 8 in a D-D arrow direction in FIG. 4, and illustrates a folded state of the cover tape 81.

As illustrated in FIG. 4 and FIG. 5, the carrier tape 8 includes the cover tape 81 and a bottom tape 82. Multiple rectangular shape component storage sections 83 are provided at an equal pitch in a tape length direction at a position close to one side edge from the center of the bottom tape 82 in the tape width direction. Components 89 are stored and held in the respective component storage sections 83. Multiple sprocket holes 84 are bored at an equal pitch in the tape length direction at a position close to another side edge of the bottom tape 82.

The cover tape 81 (illustrated by hatching) is adhered to be peelable to the upper face of the bottom tape 82. More specifically, the adhesive section 85 (illustrated in black) that extends in the tape length direction is set between the component storage section 83 of the bottom tape 82 and the one side edge. In addition, the adhesive section 86 (illustrated in black) that extends in the tape length direction is set between the component storage section 83 of the bottom tape 82 and the sprocket holes 84. A part close to both ends of the cover tape 81 is adhered to the two adhesive sections 85 and 86. The width dimension of the cover tape 81 is smaller than the bottom tape 82, the cover tape 81 covers the component storage sections 83, but does not cover the sprocket holes 84.

As illustrated is FIG. 3, the tape peeling mechanism 7 is constituted by two side plates 77 and 78, a first tape guide 71, a second tape guide 72, a tape peeling blade 73, a tape turn-up plate 74, and the like. The first tape guide 71 and the second tape guide 72 are thin plate-form members, and are arranged separately in parallel on the upper side of the feeding rail 34. The separation dimension of the feeding rail 34 from the first tape guide 71 and the second tape guide 72 is slightly larger than the thickness of the carrier tape 8. The carrier tape 8 passes between the separation dimension.

The rear of the first tape guide 71 occupies the entire width bridging between the two side plates 77 and 78. The front of the first tape guide 71 is arranged to the side of the other side plate 78. An elliptical shape sprocket hole window 711, through which the sprocket holes 84 of the carrier tape 8 are visible, is formed on the front side of the first tape guide 71. A cutout window (reference numeral omitted), through which the carrier tape 8 is visible, is formed at multiple other positions of the first tape guide 71. A tape detection sensor 712 that detects presence or absence of the carrier tape 8 is arranged to the rear of the first tape guide 71. A position mark 715 that is a positional reference is affixed to the upper face of the first tape guide 71.

The second tape guide 72 is arranged lined up close to the side of the front of the first tape guide 71, and is attached to the one side plate 77. A part corresponding to the component supply position 32 is cut out from the second tape guide 72. The position mark 725 that is a positional reference is affixed to the upper face of the second tape guide 72. An opening portion 75 that extends in the front-rear direction is formed between the first tape guide 71 and the second tape guide 72. The front side of the opening portion 75 is narrowly open in the width direction between the first and second tape guides 71 and 72, and runs up to the component supply position 32. The rear side of the opening portion 75 is formed between the first tape guide 71 and one side plate 77, and is widely open in the width direction.

The tape peeling blade 73 is attached to project from the one side plate 77 in the width direction, and is arranged on the rear side of the opening portion 75. The width of the leading end of the tape peeling blade 73 is formed to be narrow and vertically thin, and the width of the tail of the tape peeling blade 73 is formed to be wide and vertically thick. The tape peeling blade 73 is arranged such that the leading end faces the carrier tape 8 toward the rear. Furthermore, the arrangement height of the tape peeling blade 73 is adjusted, and the leading end is inserted between the bottom tape 82 and the cover tape 81.

The tape turn-up plate 74 is linked to the tail of the tape peeling blade 73 and is arranged to project from the one side plate 77 in the width direction. The tape turn-up plate 74 is arranged in parallel separated on the upper side of the first tape guide 71 and the second tape guide 72. The tape turn-up plate 74 has a tapered side edge 741, and gradually widens separated from the tape peeling blade 73 toward the front such that the cover tape 81 is turned up and it is possible to open the component storage section 83. The separation dimension of the tape turn-up plate 74 and the first tape guide 71 is adjusted such that turning up of the cover tape 81 is favorably carried out. A part corresponding to the component supply position 32 is cut out from the tape turn-up plate 74.

Next, a peeling operation of the tape peeling mechanism 7 will be described. When the leading end of the carrier tape 8 is fed out toward the tape peeling mechanism 7, the leading end of the carrier tape 8 and the tape peeling blade 73 face each other. Then, when the carrier tape 8 is further fed out, the tape peeling blade 73 is inserted between the bottom tape 82 and the cover tape 81, and advances between both tapes 82 and 81. In the present embodiment, the tape peeling blade 73 peels the one adhesive section 85 and does not peel the other adhesive section 86. Therefore, the cover tape 81 is fed out in a state of the one adhesive section 85 being peeled and the other adhesive section 86 being adhered.

The cover tape 81 progresses from the rear side to the front side of the opening portion 75 and rises above the other adhesive section 86 toward the side face of the tape peeling blade 73. Furthermore, the cover tape 81 is turned up in the direction of the other side plate 78 towards the tapered side edge 741 of the tape turn-up plate 74. Finally, the cover tape 81 is in the turned up state that is illustrated in FIG. 6 at the component supply position 32. Thereby, the upper section of the component storage section 83 is opened and allows the component 89 to be sucked. After the component 89 is sucked, the carrier tape 8 is discharged to the front of the feeder device 3 in a state in which the cover tape 81 is adhered to the bottom tape 82.

(4. Defect Example of Peeling Operation)

Figure 7:
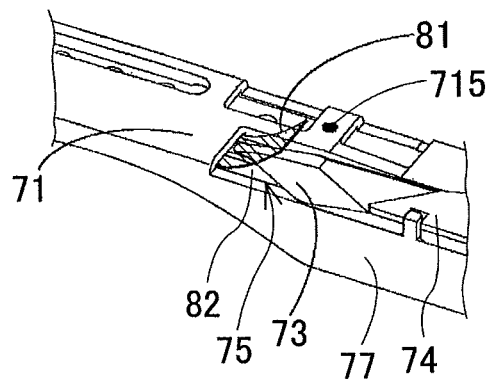
FIG. 7 is a perspective view that explains defects of total peeling of the cover tape.

Next, two examples of defects of a peeling operation of the tape peeling mechanism 7 will be described. FIG. 7 is a perspective view that explains of total peeling defect of the cover tape 81. Theoretically, the tape peeling blade 73 peels only one adhesive section 85. However, there may be a case where both adhesive sections 85 and 86 are peeled together. In this case, the entirety of the cover tape 81 deviates from the opening portion 75, and a path of the cover tape 81 becomes indeterminate. Accordingly, production of the board K should not be carried out since there is an obstacle caused by the indeterminate path of the cover tape 81 even if it is possible to suck a component 89 by the suction nozzle 46 at the component supply position 32.

Figure 8:
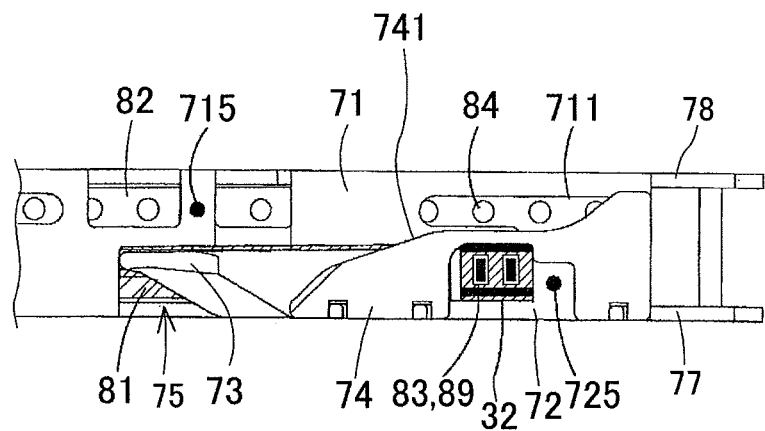
FIG. 8 is a plan view that explains defects of total passing of the cover tape.

In addition, FIG. 8 is a plan view that explains defects of total passing of the cover tape 81. The cover tape 81 is not peeled when the tape peeling blade 73 passes through the upper side of the cover tape 81 without advancing between the bottom tape 82 and the cover tape 81. By this, a full passage defect occurs in which the entirety of the carrier tape 8 is loaded up to the component supply position 32. In this case, the suction nozzle 46 is not able to suck a component 89 at the component supply position 32, and production of the board K is not carried out.

(5. Realization of Peeling Start Determination Section and Recovery Function Section by Process Flow of Control Device 6)

The component mounting machine 1 of the embodiment has the object of quickly determining defects of the peeling operation of the tape peeling mechanism 7 and reducing work of an operator by automatically recovering from defects as much as possible. In order to realize these objects, the control device 6 performs a process flow that includes processes of the peeling start determination section and the recovery function section.

As the processes of the peeling start determination section, the control device 6 determines whether or not the tape peeling blade 73 advances between the bottom tape 82 and the cover tape 81 and the peeling starts, after the leading end of the carrier tape 8 is fed out up to the tape peeling blade 73 and before the suction nozzle 46 starts a suction operation at the component supply position 32. In addition, as the processes of the recovery function section, the control device 6 carries out a recovery operation to return the leading end of the carrier tape 8 temporarily to the front of the tape peeling blade 73 and to feed the carrier tape 8 again in a case where it is determined that peeling is not started by the peeling start determination section. The process flow of the control device 6 will be described in detail below.

Figure 9:
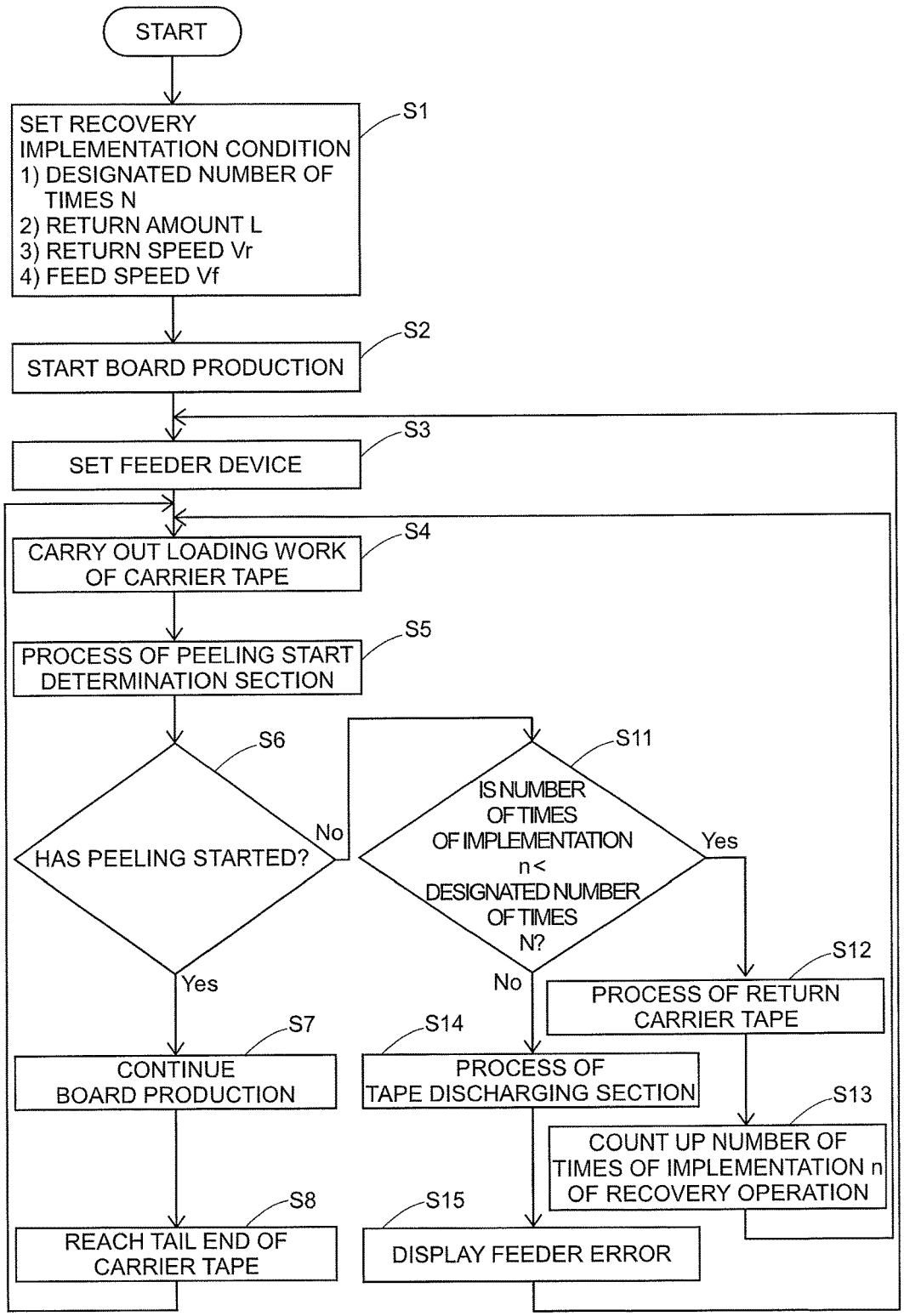
FIG. 9 is a diagram explaining a process flow of a control device that includes processes of a peeling start determination section and a recovery function section.

FIG. 9 is a diagram explaining a process flow of the control device 6 that includes processes of the peeling start determination section and the recovery function section. Note that, a part of the process flow is performed by the operator. In a first step S1 in FIG. 9, the operator sets a changeable recovery implementation condition. The recovery implementation condition includes at least one item of a designated number of times N for which the upper limit of the number of times of implementation n of the recovery operation is determined, a return amount L when the leading end of the carrier tape 8 is returned, a return speed Vr when the leading end of the carrier tape 8 is returned, and a feed speed Vf when the leading end of the carrier tape 8 is fed out again. The recovery implementation condition is set for each of the feeder groups that are classified as the feeder device 3 focusing on the width dimension, the material, or the similarity of the structure of the carrier tape 8 to be used. In addition, the recovery implementation condition may be commonly set in all feeder devices 3, or may be individually set for each feeder device 3.

In this arrangement, the designated number of times N is set considering improvement of a success rate of the recovery operation, time loss during unsuccessful recovery, and the like. For example, for the full passage defect described in FIG. 8, an improvement of the success rate by repeating the recovery operation can be anticipated. Meanwhile, in the total peeling defect described in FIG. 7, returning to the normal state is not achieved and time passes fruitlessly even if the recovery operation is carried out. Accordingly, it is necessary for the operator to set a certain designated number of times N.

In addition, it is necessary for the return amount L to be larger than a distance D1 (refer to FIG. 3) between the leading end of the tape peeling blade 73 and the component supply position 32. The reason is that the leading end of the carrier tape 8 is loaded up to the component supply position 32 at a point in time at which the processes of the peeling start determination section of the fifth step S5 are carried out. If the return amount L is set to be smaller than the distance D1, the recovery operation may be meaningless because the leading end of the carrier tape 8 is not returned to the front of the tape peeling blade 73. Meanwhile, preferably the return amount L is smaller than a distance D2 (refer to FIG. 3) between the tape detection sensor 712 and the component supply position 32. If the return amount L is set to be larger than the distance D2, the leading end of the carrier tape 8 is returned further to the tape insertion port 33 side than the tape detection sensor 712. Thereby, it is not preferable for an excess process to be necessary since the tape detection sensor 712 outputs a signal of no tape detection.

In addition, the feed speed Vf is able to control a condition when the tape peeling blade 73 advances to the leading end of the carrier tape 8 and influences the success rate of the recovery operation. For example, it is possible to anticipate a stable recovery operation by setting the feed speed Vf during the recovery operation to be smaller than the first time in a case where the defect occurs in the first peeling operation. In addition, for example, a state in which the feed speed Vf is unstable during acceleration is unpreferable when the tape peeling blade 73 advances to the leading end of the carrier tape 8 in relation to the return amount L. Note that, the influence of the return speed Vr may be small, but the maximum setting of the return speed Vr may be one cause for unnecessary tension or slack occurring in the carrier tape 8.

Next, in a second step S2, the type of board K to be produced is determined and production of the board is started. However, calculation of an optimization process or setup work by the operator is carried out at first before actual production in which the components 89 are sucked and mounted by the suction nozzle 46 is started. In the optimization process, depending on the type of the board K to be produced, the mounting order of the components 89, the type of the suction nozzle 46 that is used, an alignment sequence on the pallet table 91 of the feeder device 3, or the like is optimized. The operator prepares the suction nozzle 46, the feeder device 3, the tape reel 39, or the like based on the calculation result of the optimization process.

In the subsequent third step S3, the operator sets the feeder device 3 on the pallet table 91 as a part of the setup work. In the subsequent fourth step S4, loading work of the carrier tape 8 is carried out. In the first loading work, the operator sets the tape reel 39 in the feeder device 3, and inserts the leading end of the carrier tape 8 in the tape insertion port 33, and hereinafter the loading work is carried out by the automatic loading function of the feeder device 3. Thereby, the leading end of the carrier tape 8 is loaded up to the component supply position 32.

In the subsequent fifth step S5, the control device 6 carries out the processes of the peeling start determination section using the realized image determination section using the board camera 47 of the mounting head 44 and software. Specifically, the control device 6 images the carrier tape 8 by moving the board camera 47 in a range from the tape peeling blade 73 up to the component supply position 32, performs image processing on the captured image, and determines whether or not peeling has started. For example, it is possible to set four locations of the imaging positions P1 and P2 of the tape peeling blade 73 that is illustrated in FIG. 3, an imaging position P3 of the sprocket hole window 711, and an imaging position P4 of the component supply position 32 as the imaging positions which the board camera 47 images. The imaging positions P1 to P4 are accurately positionally controlled by referring to position marks 715 and 725. Note that, the board camera 47 may not collectively image the multiple the imaging positions P1 to P4 of the four locations described above and may individually image the imaging positions.

The board camera images the carrier tape 8 at the imaging positions P1 to P4, but in practice, there is a case where the cover tape 81 is imaged, a case where the bottom tape 82 is imaged, and a case where the configuring members of the tape peeling mechanism 7 other than the carrier tape 8 are imaged. For example, the three cases are able to be discriminated by a difference of luminance of the image. Then, the control device 6 is able to determine whether or not peeling is started based on discriminated content.

The control device 6 determines that peeling starts or there is a total peeling defect in a case where the cover tape 81 is discriminated at the imaging position P1. The control device 6 determines full passage defect in a case where the tape peeling blade 73 is discriminated at the imaging position P1. The control device 6 determines that peeling starts or a full passage defect in a case where the tape peeling blade 73 is discriminated at the imaging position P2. The control device 6 determines the total peeling defect in a case where the cover tape 81 is discriminated at the imaging position P2.

Furthermore, the control device 6 determines that peeling starts in a case where the cover tape 81 is discriminated at the imaging position P3 of the sprocket hole window 711. The control device 6 determines the total peeling or the full passage defect in a case where the sprocket hole 84 of the bottom tape 82 is discriminated at the imaging position P3. The control device 6 determines that peeling starts or there is the total peeling defect in a case where the bottom tape 82 is discriminated at the imaging position P4 of the component supply position 32. The control device 6 determines the full passage defect in a case where the cover tape is discriminated at the imaging position P4.

Accordingly, it is possible to improve precision of the determination result of whether or not peeling is started by combining imaging and discrimination at the multiple imaging positions P1 to P4. The total peeling defect of the cover tape 81 is determinable according to the present embodiment, and it is not possible to determine in the related art based on whether or not it is possible to suck a component 89 at the component supply position 32. Note that, the applicant of the present application already applied the technical details for determining whether or not peeling is started according to the difference in luminance of images of the four locations of the imaging positions P1 to P4 in Japanese Patent Application No. 2014-189203.

In the subsequent sixth step S6, the process proceeds to the seventh step S7 in which the control device 6 performs the process flow when it is determined that peeling starts, and the process proceeds to the eleventh step S11 in which the control device 6 performs the process flow when it is not determined that peeling starts. In the seventh step S7, the control device 6 starts and continues actual production of the board K by controlling suction and mounting of the components 89 by the suction nozzle 46. As actual production continues, in the eighth step S8, the carrier tape 8 is fed out up to the tail end and there is a component shortage. By this, the operator prepares a new tape reel 39, and the process returns to the fourth step S4.

In addition, in the eleventh step S11, the process proceeds to the twelfth step S12 in which the control device 6 performs the process flow when the number of times of implementation n of the recovery operation is less than the designated number of times N. The process proceeds to the fourteenth step S14 in which the control device 6 performs the process flow by determining that the defects of the peeling operation are not eliminated and recovery is unsuccessful when the number of times of implementation n reaches the designated number of times N. The twelfth step S12 is a return process of the carrier tape 8 that is carried out when any defect occurs in the peeling operation and the number of times of implementation n of the recovery operation is less than the designated number of times N. The control device 6 controls the return speed Vr that is set in the first step S1 so as to return the carrier tape 8 to the front side by the return amount L.

In the thirteenth step S13, the control device 6 returns to the fourth step S4 in which the process flow is performed by counting up the number of times of implementation n of the recovery operation by one. In the fourth step S4 when the process returns from the thirteenth step S13, not involving the operator, the control device 6 carries out the automatic loading function of the carrier tape 8. That is, the control device 6 controls using the feed speed Vf that is set in the first step S1 so as to feed out again the carrier tape 8 by the return amount L. After that, the fifth step S5 and thereafter are repeated. The recovery function section of the present disclosure is realized by the eleventh step S11, the twelfth step S12, the thirteenth step S13, and the fourth step S4.

In addition, in the fourteenth step S14 when recovery is unsuccessful, the control device 6 carries out the automatic discharge function that corresponds to the process of the tape discharging section. Thereby, the leading end of the carrier tape 8 is discharged closed to the tape insertion port 33. In the subsequent fifteenth step S15, the process returns to the third step S3 in which the process flow is performed by the control device 6 displaying a feeder error and notifying the operator. In the third step S3, the operator replaces the feeder device 3 in which defects are not eliminated to a new feeder device 3. After that, the fourth step S4 and thereafter are repeated.

(6. Aspects and Effects of Component Mounting Machine 1 of Embodiment)

The component mounting machine 1 of the embodiment is provided with: a feeder device 3 that supplies a component 89 from a component storage section 83 at a component supply position 32, and has a tape feeding mechanism that feeds out a carrier tape 8 including a bottom tape 82 which stores the components 89 in the respective multiple component storage sections 83 and a cover tape 81 which is adhered to the bottom tape 82 and covers the component storage sections 83, and a tape peeling mechanism 7 that has a tape peeling blade 73 that advances between the bottom tape 82 and the cover tape 81 as the carrier tape 8 is fed out and carries out peeling; and a component transfer device 4 that has a mounting head 44 that holds a suction nozzle 46 that sucks the component 89 at the component supply position 32, and mounts the component 89 on a board K, and a head driving mechanism that drives the mounting head 44, the component mounting machine 1 further provided with a peeling start determination section (fifth step S5) that determines whether or not the tape peeling blade 73 advances between the bottom tape 82 and the cover tape 81 and the peeling starts, after the leading end of the carrier tape 8 is fed out up to the tape peeling blade 73 and before the suction nozzle 46 starts a suction operation at the component supply position 32; and a recovery function section (eleventh step S11, twelfth step S12, thirteenth step S13, and fourth step S4) that carries out a recovery operation in which the recovery function section returns the leading end of the carrier tape 8 temporarily to the front of the tape peeling blade 73 and feeds out the carrier tape 8 again in a case where it is determined that peeling is not started by the peeling start determination section.

Thereby, the component mounting machine determines whether or not the tape peeling blade 73 advances between the bottom tape 82 and the cover tape 81 and the peeling starts, after the leading end of the carrier tape 8 is fed out up to the tape peeling blade 73 and before the suction nozzle 46 starts the suction operation at the component supply position 32, and carries out the recovery operation in a case where it is determined that peeling is not started. Accordingly, in comparison with the related art in which error information is issued when the suction nozzle 46 does not suck a component 89 after actual production has started, it is possible to quickly determine whether or not peeling is started.

In particular, in the setup work when the type of board K to be produced is changed, in many cases, the tape reels 39 are replaced in multiple feeder devices 3 and the carrier tapes 8 are loaded. In this case, according to the embodiment, it is possible to determine the defect of the peeling operation in all feeder devices 3 before actual production starts, and ensure completeness in component supply by a countermeasure by a predetermined recovery operation or the operator. In contrast to this, in the related art, it is not possible to determine a defect of the peeling operation during setup work, the defect of the peeling operation is identified after the actual production has started, and thereafter, the countermeasure is necessary and the production efficiency is lowered. Accordingly, according to the present embodiment, whether or not peeling has started is determined before starting the actual production and it is possible to prevent lowering of the production efficiency.

Furthermore, the peeling start determination section is configured to include the board camera 47 that is provided in the mounting head 44 and images the position fiducial mark of the board K, and an image determination section that images the carrier tape 8 by moving the board camera 46 in a range from the tape peeling blade 73 up to the component supply position 32 and imaging the carrier tape 8, performs image processing on the captured image, and determines whether or not peeling starts.

Thereby, it is possible to determine the total peeling defect of the cover tape 81 for which it is not possible to determine in the related art based on whether or not it is possible to suck the components 89 at the component supply position 32. That is, according to the embodiment, defect determination precision of the peeling operation is higher than in the related art. In addition, it is possible to configure the peeling start determination section by combining the existing board camera 47 and the software of the control device 6, and since the sensor and the like may not be added, raising of costs is reduced.

Furthermore, a changeable recovery implementation condition when the recovery function section implements the recovery operation includes at least one item of a designated number of times N for which the upper limit of the number of times of implementation n of the recovery operation is determined, a return amount L when the leading end of the carrier tape 8 is returned, a return speed Vr when the leading end of the carrier tape 8 is returned, and a feed speed Vf when the leading end of the carrier tape 8 is fed out again. Thereby, it is possible to variably set the recovery implementation condition. Accordingly, in comparison to a case where the same peeling operation is simply repeated, the success rate of the recovery operation is increased.

Furthermore, the recovery implementation condition includes the designated number of times N that sets an upper limit of the number of times of implementation n of the recovery operation, and a tape discharging section (fourteenth step S14) is further provided that returns the leading end of the carrier tape 8 to the front side and discharges the carrier tape 8 when recovery is unsuccessful that it is determined that peeling is not started by the peeling start determination section even if the recovery function section implements the recovery operation of the designated number of times N. Thereby, it is possible to reduce the work of the operator such as withdrawing the carrier tape 8 and confirming the state of the leading end or correcting the state of the leading end.

In addition, the component mounting machine 1 of the embodiment is able to carry out a tape peeling recovery method. That is, a tape peeling recovery method of a component mounting machine 1 of the embodiment that is provided with: the feeder device 3 that has the tape feeding mechanism which feeds out the carrier tape 8 including the bottom tape 82 which stores the components 89 in the respective multiple component storage sections 83 and the cover tape 81 which is adhered to the bottom tape 82 and covers the component storage sections 83, and a tape peeling mechanism 7 which has the tape peeling blade 73 advancing between the bottom tape 82 and the cover tape 81 as the carrier tape 8 is fed out and carries out peeling, and supplies the component 89 from the component storage section 83 at the component supply position 32; the component transfer device 4 that has the mounting head 44 which holds the suction nozzle 46 which sucks the component 89 at the component supply position 32 and mounts the component on the board K, and the head driving mechanism which drives the mounting head 44, the method comprising a peeling start determination step (fifth step S5) of determining whether or not the tape peeling blade 73 advances between the bottom tape 82 and the cover tape 81 and the peeling starts, after the leading end of the carrier tape 8 is fed out up to the tape peeling blade 73 and before the suction nozzle 46 starts a suction operation at the component supply position 32; and a recovery function step (eleventh step S11, twelfth step S12, thirteenth step S13, and fourth step S4) of carrying out a recovery operation in which the recovery function section returns the leading end of the carrier tape 8 temporarily to the front of the tape peeling blade 73 and feeds out the carrier tape again in a case where it is determined that peeling is not started by the peeling start determination step.

The effect of the tape peeling recovery method of the component mounting machine of the embodiment is the same as the effect of the component mounting machine 1 of the embodiment.

(7. Applications and Modifications of the Embodiment)

Note that, in the embodiment, when recovery is unsuccessful, the process returns from the fifteenth step S15 to the third step S3 and the feeder device 3 is replaced, but is not limited thereto. For example, when recovery is unsuccessful, the operator may perform the loading work of the carrier tape 8 again in the fourth step S4 after withdrawing the carrier tape 8 from the insertion port 33 confirming the state of the leading end of the carrier tape 8 and preparing the state of the leading end of the carrier tape 8. Various other applications or modifications of the present disclosure are possible.

REFERENCE SIGNS LIST

1: COMPONENT MOUNTING MACHINE, 2: BOARD CONVEYANCE DEVICE, 3: FEEDER DEVICE, 32: COMPONENT SUPPLY POSITION, 4: COMPONENT TRANSFER DEVICE, 44: MOUNTING HEAD, 46: SUCTION NOZZLE, 47: BOARD CAMERA, 5: COMPONENT CAMERA, 6: CONTROL DEVICE, 7: TAPE PEELING MECHANISM, 73: TAPE PEELING BLADE, 8: CARRIER TAPE, 81: COVER TAPE, 82: BOTTOM TAPE, 83: COMPONENT STORAGE SECTION, 89: COMPONENT, 9: FRAME, K: BOARD

The invention claimed is:

1. A component mounting machine comprising:
a feeder device that has a tape feeding mechanism which feeds out a carrier tape including a bottom tape that stores components in respective multiple component storage sections and a cover tape that is adhered to the bottom tape and covers the components in the storage sections, and a tape peeling mechanism which has a tape peeling blade configured to advance between the bottom tape and the cover tape as the carrier tape is fed out in order to carry out peeling of the cover tape from the bottom tape to release a component from a component storage section, and supplies the component from the component storage section at a component supply position;
a component transfer device that has a mounting head which holds a suction nozzle which sucks the component at the component supply position, and mounts the component on a board, and a head driving mechanism which drives the mounting head;
a peeling start determination section that determines if peeling of the cover tape from the bottom tape starts based on whether or not the tape peeling blade advances between the bottom tape and the cover tape after a leading end of the carrier tape is fed out up to the tape peeling blade and before the leading end of the carrier tape is fed out up to the component supply position and the suction nozzle starts a suction operation at the component supply position; and a recovery function section that carries out a recovery operation in which the recovery function section returns the leading end of the carrier tape temporarily to a front side of the tape peeling blade and feeds out the carrier tape again in a case where it is determined that peeling of the cover tape from the bottom tape is not started by the peeling start determination section.

2. The component mounting machine according to claim 1, wherein the peeling start determination section is configured to include a board camera that is provided in the mounting head and images a position fiducial mark of the board, and an image determination section that images the carrier tape by moving the board camera in a range from the tape peeling blade up to the component supply position, performs image processing on the captured image, and determines whether or not peeling of the cover tape from the bottom tape starts based on the image processing of the captured image.

3. The component mounting machine according to claim 1, wherein a changeable recovery implementation condition when the recovery function section implements the recovery operation includes at least one item of an upper limit of a number of times of implementation of the recovery operation, a return amount when the leading end of the carrier tape is returned, a return speed when the leading end of the carrier tape is returned, and a feed speed when the leading end of the carrier tape is fed out again.

4. The component mounting machine according to claim 3, wherein the recovery implementation condition includes the upper limit of the number of times of implementation of the recovery operation, and the component mounting machine further comprises a tape discharging section that returns the leading end of the carrier tape to the front side, and discharges the carrier tape when recovery is unsuccessful in which it is determined that peeling of the cover tape from the bottom tape is not started by the peeling start determination section even if the recovery function section implements the recovery operation of the upper limit of the number of times of implementation.

5. A tape peeling recovery method of a component mounting machine including a feeder device that has a tape feeding mechanism which feeds out a carrier tape including a bottom tape which stores components in respective multiple component storage sections and a cover tape which is adhered to the bottom tape and covers the components in the storage sections, and a tape peeling mechanism which has a tape peeling blade configured to advance between the bottom tape and the cover tape as the carrier tape is fed out in order to carry out peeling of the cover tape from the bottom tape to release a component from a component storage section, and supplies the component from the component storage section at a component supply position, and a component transfer device that has a mounting head which holds a suction nozzle which sucks the component at the component supply position, and mounts the component on a board, and a head driving mechanism which drives the mounting head, the method comprising:

a peeling start determination step of determining if peeling of the cover tape from the bottom tape starts based on whether or not the tape peeling blade advances between the bottom tape and the cover tape after a leading end of the carrier tape is fed out up to the tape peeling blade and before the leading end of the carrier tape is fed out up to the component supply position and the suction nozzle starts a suction operation at the component supply position; and a recovery function step of carrying out a recovery operation in which the recovery function section returns the leading end of the carrier tape temporarily to a front side of the tape peeling blade and feeds out the carrier tape again in a case where it is determined that peeling of the cover tape from the bottom tape is not started in the peeling start determination step.

* * * * *